United States Patent [19]
Lue

[11] Patent Number: 5,831,513
[45] Date of Patent: Nov. 3, 1998

[54] MAGNETIC FIELD SENSING DEVICE

[75] Inventor: Lormen Jaw-Chyng Lue, Hsin Tien, Taiwan

[73] Assignee: United Microelectronics Corp., Hsinchu, Taiwan

[21] Appl. No.: 795,353

[22] Filed: Feb. 4, 1997

[51] Int. Cl.⁶ .................................................. H01L 43/00
[52] U.S. Cl. ............................................. 338/324; 257/425
[58] Field of Search .................... 338/32 H; 360/112, 360/113; 324/251; 257/421–425

[56] References Cited

U.S. PATENT DOCUMENTS

| | | | |
|---|---|---|---|
| 4,987,467 | 1/1991 | Popovic et al. | 357/27 |
| 5,055,820 | 10/1991 | Kimmura et al. | 338/32 H |
| 5,183,767 | 2/1993 | Baratte et al. | 437/11 |
| 5,198,795 | 3/1993 | Shibasaki et al. | 328/32 H |
| 5,442,221 | 8/1995 | Mosser et al. | 257/425 |
| 5,488,250 | 1/1996 | Henning et al. | 257/421 |
| 5,491,461 | 2/1996 | Partin et al. | 338/32 R |
| 5,530,345 | 6/1996 | Murari et al. | 324/207 |
| 5,572,058 | 11/1996 | Biard et al. | 257/421 |
| 5,604,433 | 2/1997 | Theus et al. | 324/251 |
| 5,662,694 | 9/1997 | Lindman et al. | 607/60 |

*Primary Examiner*—Teresa J. Walberg
*Assistant Examiner*—Jeffrey Pwu
*Attorney, Agent, or Firm*—Pillsbury Madison & Sutro LLP

[57] ABSTRACT

A magnetic field sensing device for simultaneously measuring all components of a magnetic field is disclosed. The present invention includes a conductive stack formed in a semiconductor substrate, where the conductive stack includes some ion-implanted layers abutting to each other, and each of the ion-implanted layers has a different and decreasing dosage level down to the bottom layer. The present invention also includes a first conductive contact on a first end of the top layer surface of the ion-implanted layers, and a second conductive contact on a second end of the top layer surface of the ion-implanted layers. A current flows into the first conductive contact and leave the second conductive contact, so that a horizontal magnetic field that exerts on the magnetic field sensing device is measured.

20 Claims, 3 Drawing Sheets

MAGNETIC FIELD SENSING DEVICE

BACKGROUND OF THE INVENTION

1. Field of the Invention

The present invention relates to a magnetic field sensor, and particularly to a magnetic field sensing device for simultaneously measuring all components of a magnetic field or several horizontal magnetic fields.

2. Description of the Prior Art

Hall sensor is conventionally used as a semiconductor device for measuring the magnitude of magnetic field according to the Hall effect. The Hall effect is a phenomenon that occurs when both an electric current and magnetic field impose on a conductive plate as shown in FIG. 1. When a current I is applied in the shown direction and a magnetic field B in a downward direction, a resulting Hall electric field EH is then generated in the designated direction as shown in the figure, and is given by $$E_H = R_H I B / A$$

where $R_H$ is the Hall coefficient, and A the cross section of the conductive plate. Although the Hall sensor is commercially used to measure the magnitude of the magnetic field, a component other than the perpendicular direction to the surface of the Hall sensor could not be conveniently figured out in one measurement.

SUMMARY OF THE INVENTION

In accordance with the present invention, a magnetic sensing device is provided for simultaneously measuring all components of a magnetic field or several horizontal magnetic fields. In one embodiment, the present invention includes some conductive stacks formed in a semiconductor substrate, wherein each conductive stack includes some ion-implanted layers abutting to each other, and each of the ion-implanted layers has different and decreasing dosage level down to the bottom layer of the ion-implanted layers. The present invention also includes a first conductive contact on a first end of the top layer surface of the ion-implanted layers in each of the conductive stacks, a second conductive contact on a second end of the top layer surface of the ion-implanted layers in each of the conductive stacks. A current flows between the first conductive contact and the second conductive contact, so that some horizontal magnetic fields exerting on this magnetic field sensing device are measured.

DESCRIPTION OF THE PREFERRED EMBODIMENT

Figure 1:
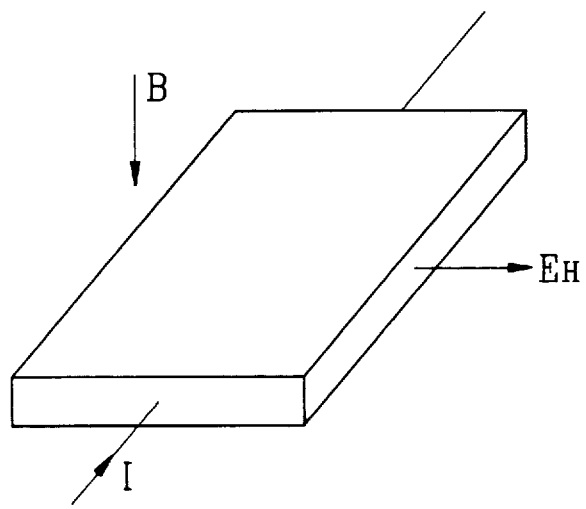
FIG. 1 shows a perspective view of a conventional Hall sensor.
Figure 2A:
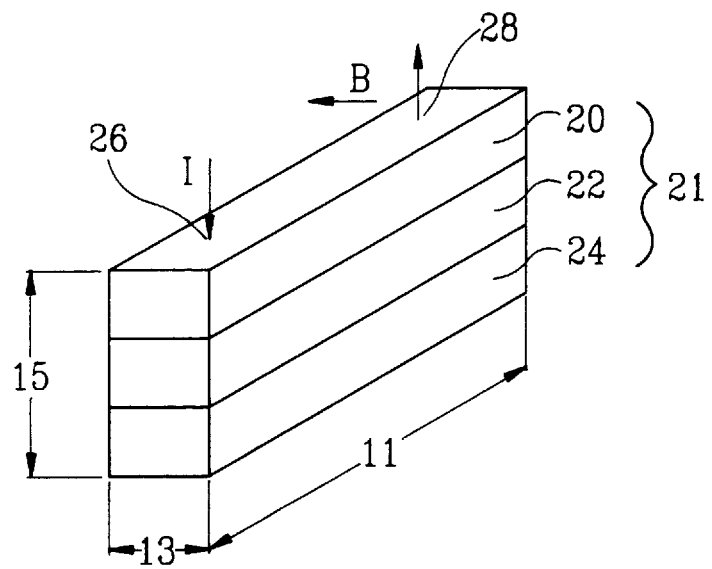
FIG. 2A shows the structure in perspective view of one embodiment according to the present invention.

FIG. 2A shows the structure in perspective view of one embodiment according to the present invention. This stacked structure 21 includes some, three in this embodiment, layers 20, 22 and 24, which possess different dosage level in a decreasing manner, that is, the first layer 20 has a dosage higher than the second layer 22, and the second layer 22 further has a dosage higher than the third layer 24. In this embodiment, N type implant source is used in forming the stacked layers, and dosage level in respective layer is designated as $N^{++}$ for the first layer 20, $N^+$ for the second layer 22 and N for the third layer 24.

Figure 2B:
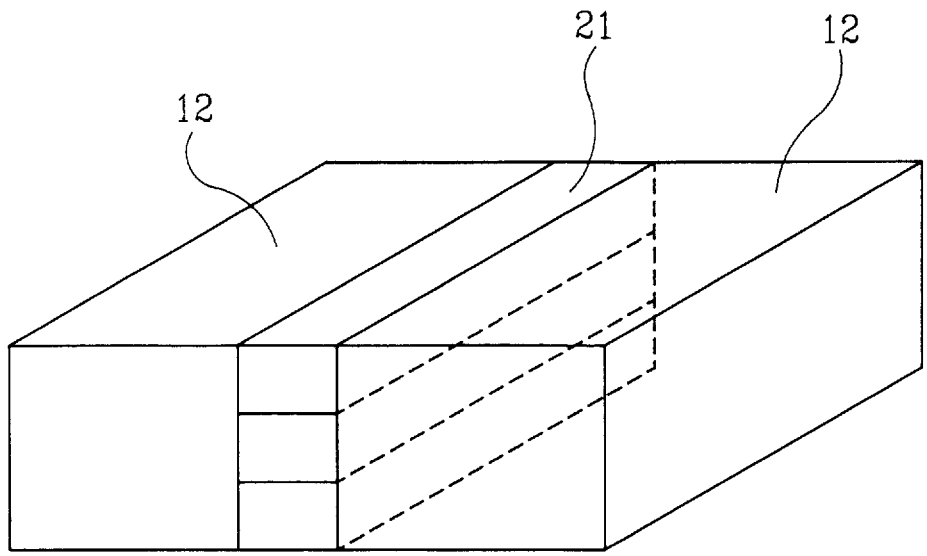
FIG. 2B shows the structure in perspective view of another embodiment according to the present invention.

FIG. 2B shows another embodiment according to the present invention. In addition to the stacked sensor 21, trenches 12 or isolation-filled trenches 12 are adjacent to the stacked sensor 21 as isolation blocks.

Figure 2C:
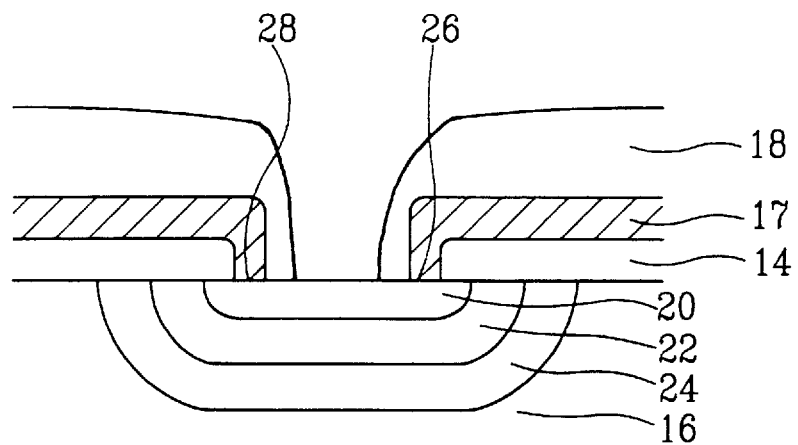
FIG. 2C shows the cross-sectional view of the stacked sensor.

FIG. 2C shows the cross-sectional view of the stacked sensor 21 (FIG. 2B). The formation of this structure is done through couples of conventional processes. In this embodiment, first ion implant and a follow-up diffusion are performed, resulting in the first layer 20 with dosage $N^{++}$. Subsequent ion implant and diffusion is applied to form the second layer 22 with dosage $N^+$. Finally, the third layer 24 is formed using ion implant and diffusion process. In this embodiment, N type ion such as Arsenide (As) or Phosphorous (P) is used as implant source, and the dosages of $N^{++}$, $N^+$ and N are respectively about 5E15, 5E14 and 5E13 atoms/cm$^2$. Referring to FIG. 2A, the length 11, the width 13 and the depth 15 is respectively about 100, 10 and 5 $\mu$m.

After an insulating layer 14 such as a pad oxide is patterned on the substrate 16 where the layers 20, 22 and 24 reside in, a metal layer 17 is further patterned to make two contact points 26 and 28. Usually, the metal layer 17 and a portion of the substrate 16 of the resultant structure are covered by material 18 such as high-$\mu$ metal so that the resultant sensor is not disturbed by nearby sensor or semiconductor device.

Figure 2D:
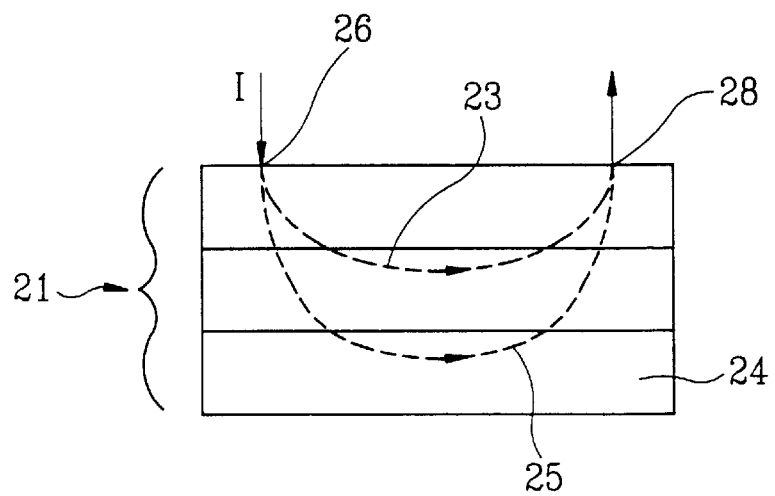
FIG. 2D shows the cross-sectional view of the stacked sensor, illustrating the movement of the electrons.

Because of the highest conductivity of the first layer 20, a current entering into the front contact point 26 flows near the upper surface of the first layer 20, and finally leave the first layer 20 at the rear contact point 28. A quite different result occurs when a magnetic field B perpendicular to the stacked structure 21 is applied. The electrons flowing near the surface of the first layer 20 are influenced under a Lorentz force in accordance with the magnetic field B, therefore exerting and forcing the electrons toward the second layer 22 or even to the third layer 24 when the magnitude of the magnetic field B is large enough. The resultant movement of the electrons is shown schematically in FIG. 2D, which illustrates the cross-sectional view of the stacked structure 21. Path 23 and path 25 are examples demonstrating the movement of the electrons influenced by an external magnetic field B (FIG. 2A), where the electrons following the path 25 are under a magnetic field stronger than the magnetic field for the path 23. Therefore, the electrons on the path 25 experience more resistivity than the electrons on the path 23 due to the increasing resistivity toward the bottom layer 24. For every magnetic strength, a corresponding resistivity can be figured out by measuring the voltage and current between the contact points 26 and 28.

Figure 3:
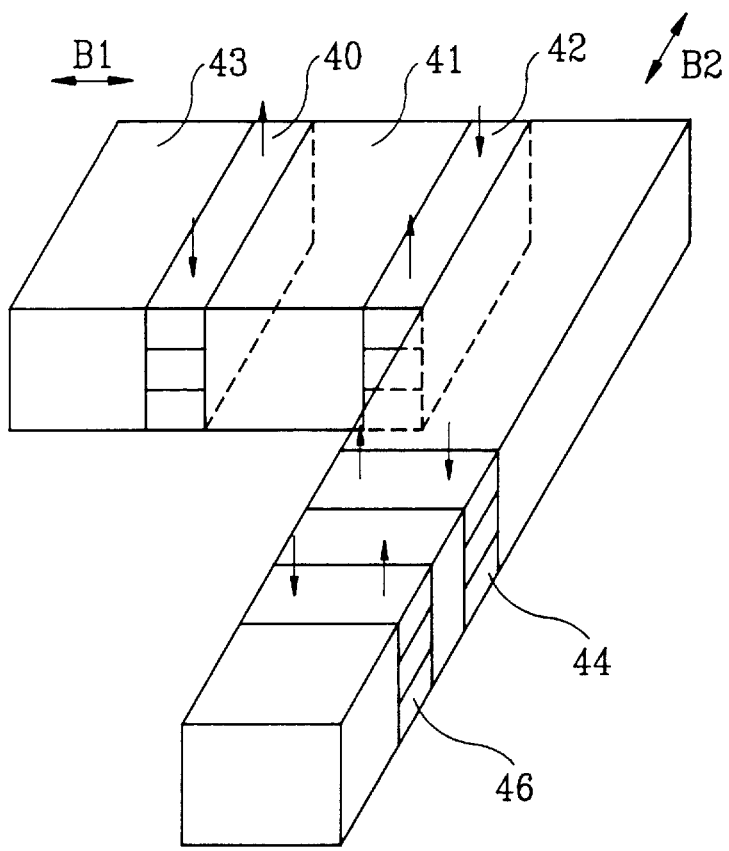
FIG. 3 shows the structure in perspective view of another embodiment according to the present invention.

After a calibration procedure is completed where couples of the aforementioned magnetic field strength and their corresponding resistivity are collected, the stacked structure 21 can then be used as a sensor to measure the magnitude of an external magnetic field. A magnetic field in a direction opposite to the magnetic field B shown in FIG. 2A can also be measured by reversing the direction of the applied current. Further, a magnetic field 90 degree from the shown magnetic field B can be measured by rotating the stacked sensor 21 to 90 degree in a horizontal manner. Practically, a placement of FIG. 3 is used to simultaneously measure the magnetic fields in both B1 and B2 direction, where sensors 40 and 42 are used to sense the magnetic field B1 and sensors 44 and 46 to sense the magnetic field B2. The components of any horizontal magnetic field differing in an angle with the shown magnetic field B1 or B2 can also be measured in the same manner. Referring to FIG. 3, regions 41 or 43 is a trench or an isolation-filled trench used as an isolation block so that the electrons are moving confinedly in each sensor. In this embodiment, those sensors 40, 42, 44 and 46 can measure magnetic field approximately in the range 0.5~10 gauss.

Although specific embodiments have been illustrated and described, it will be obvious to those skilled in the art that various modifications may be made without departing from the spirit which is intended to be limited solely by the appended claims.

What is claimed is:

1. A magnetic field sensor, comprising:
 a conductive stack formed in a semiconductor substrate, wherein said conductive stack comprises a plurality of ion-implanted layers abutting to each other, each of said ion-implanted layers having different and decreasing dosage level down to a bottom layer of the ion-implanted layers;
 a first conductive contact on a first end of top layer surface of the ion-implanted layers; and
 a second conductive contact on a second end of the top layer surface of the ion-implanted layers, wherein a current flows into said first conductive contact and leave said second conductive contact, a horizontal magnetic field exerting on the magnetic field sensor.

2. The magnetic field sensor according to claim 1, wherein said ion-implanted layer is formed using N type implant source.

3. The magnetic field sensor according to claim 1, wherein said conductive stack comprises a first layer at the top of said conductive stack, a second layer in the middle of said conductive stack, and a third layer at the bottom of said conductive stack.

4. The magnetic field sensor according to claim 3, wherein said first layer has dosage of about 5E15 atoms/cm$^2$, said second layer has dosage of about 5E14 atoms/cm$^2$, and said third layer has dosage of about 5E13 atoms/cm$^2$.

5. The magnetic field sensor according to claim 3, wherein the length of said conductive stack is about 100 $\mu$m, the width of said conductive stack is about 10 $\mu$m, and the depth of said conductive stack is about 5 $\mu$m.

6. The magnetic field sensor according to claim 1, further comprising a protective layer formed over said first conductive contact and said second conductive contact.

7. The magnetic field sensor according to claim 1, further comprising a plurality of isolation regions adjacent to said conductive stack, thereby confining the flow of the current.

8. A magnetic field sensor, comprising:
 a conductive stack formed in a semiconductor substrate, wherein said conductive stack comprises a plurality of ion-implanted layers abutting to each other, each of said ion-implanted layers having different and decreasing dosage level down to a bottom layer of the ion-implanted layers;
 a first conductive contact on a first end of top layer surface of the ion-implanted layers;
 a second conductive contact on a second end of the top layer surface of the ion-implanted layers, wherein a current flows into said first conductive contact and leave said second conductive contact, a horizontal magnetic field exerting on the magnetic field sensor; and
 a plurality of isolation regions adjacent to said conductive stack, thereby confining the flow of the current.

9. The magnetic field sensor according to claim 8, wherein said ion-implanted layer is formed using N type implant source.

10. The magnetic field sensor according to claim 8, wherein said conductive stack comprises a first layer at the top of said conductive stack, a second layer in the middle of said conductive stack, and a third layer at the bottom of said conductive stack.

11. The magnetic field sensor according to claim 10, wherein said first layer has dosage of about 5E15 atoms/cm$^2$, said second layer has dosage of about 5E14 atoms/cm$^2$, and said third layer has dosage of about 5E13 atoms/cm$^2$.

12. The magnetic field sensor according to claim 10, wherein the length of said conductive stack is about 100 $\mu$m, the width of said conductive stack is about 10 $\mu$m, and the depth of said conductive stack is about 5 $\mu$m.

13. The magnetic field sensor according to claim 8, further comprising a protective layer formed over said first conductive contact and said second conductive contact.

14. A magnetic field sensing device, comprising:
 a plurality of conductive stacks formed in a semiconductor substrate, wherein said conductive stack comprises a plurality of ion-implanted layers abutting to each other, each of said ion-implanted layers having different and decreasing dosage level down to a bottom layer of the ion-implanted layers;
 a first conductive contact on a first end of top layer surface of the ion-implanted layers in each of the plurality of said conductive stacks; and
 a second conductive contact on a second end of the top layer surface of the ion-implanted layers in each of the plurality of said conductive stacks, wherein a current flows between said first conductive contact and said second conductive contact, at least a horizontal magnetic field exerting on the magnetic field sensing device.

15. The magnetic field sensing device according to claim 14, wherein said ion-implanted layer is formed using N type implant source.

16. The magnetic field sensing device according to claim 14, wherein said conductive stack comprises a first layer at the top of said conductive stack, a second layer in the middle of said conductive stack, and a third layer at the bottom of said conductive stack.

17. The magnetic field sensing device according to claim 16, wherein said first layer has dosage of about 5E15 atoms/cm$^2$, said second layer has dosage of about 5E14 atoms/cm$^2$, and said third layer has dosage of about 5E13 atoms/cm$^2$.

18. The magnetic field sensing device according to claim 16, wherein the length of said conductive stack is about 100 $\mu$m, the width of said conductive stack is about 10 $\mu$m and the depth of said conductive stack is about 5 $\mu$m.

19. The magnetic field sensing device according to claim 14, further comprising a protective layer formed over said first conductive contact and said second conductive contact.

20. The magnetic field sensing device according to claim 14, further comprising a plurality of isolation regions adjacent to the plurality of said conductive stacks, said isolation regions being spaced apart by said conductive stack, thereby confining the flow of the current.

* * * * *